United States Patent
Li et al.

(10) Patent No.: US 9,281,843 B2
(45) Date of Patent: Mar. 8, 2016

(54) SYSTEMS AND METHODS FOR REDUCED CONSTRAINT CODE DATA PROCESSING

(71) Applicant: LSI Corporation, San Jose, CA (US)

(72) Inventors: Shu Li, San Jose, CA (US); Anatoli A. Bolotov, San Jose, CA (US); Shaohua Yang, San Jose, CA (US); Fan Zhang, Milpitas, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 158 days.

(21) Appl. No.: 13/853,711

(22) Filed: Mar. 29, 2013

(65) Prior Publication Data

US 2014/0289582 A1   Sep. 25, 2014

Related U.S. Application Data

(60) Provisional application No. 61/804,264, filed on Mar. 22, 2013.

(51) Int. Cl.
  *H03M 13/11* (2006.01)
  *H03M 13/29* (2006.01)
  *H03M 13/00* (2006.01)
  *G11B 20/18* (2006.01)

(52) U.S. Cl.
  CPC ......... *H03M 13/116* (2013.01); *G11B 20/1833* (2013.01); *H03M 13/1111* (2013.01); *H03M 13/1171* (2013.01); *H03M 13/2957* (2013.01); *H03M 13/6325* (2013.01); *H03M 13/6343* (2013.01)

(58) Field of Classification Search
  CPC .................................................. H03M 13/116
  See application file for complete search history.

(56) References Cited

U.S. PATENT DOCUMENTS

| | | | |
|---|---|---|---|
| 4,553,221 | A | 11/1985 | Hyatt |
| 5,278,703 | A | 1/1994 | Rub et al. |
| 5,278,846 | A | 1/1994 | Okayama |
| 5,317,472 | A | 5/1994 | Schweitzer, III |
| 5,325,402 | A | 6/1994 | Ushirokawa |
| 5,392,299 | A | 2/1995 | Rhines |
| 5,417,500 | A | 5/1995 | Martinie |
| 5,450,253 | A | 9/1995 | Seki |
| 5,513,192 | A | 4/1996 | Janku |
| 5,523,903 | A | 6/1996 | Hetzler |

(Continued)

FOREIGN PATENT DOCUMENTS

WO   WO 2010/126482 A1   11/2010

OTHER PUBLICATIONS

U.S. Appl. No. 13/426,714, filed Mar. 22, 2012, Shaohua Yang.

(Continued)

*Primary Examiner* — Steve Nguyen

(57) ABSTRACT

The present inventions are related to systems and methods for data processing, and more particularly to systems and methods for performing data decoding. In one case a data processing system is disclosed that includes a decoder circuit operable to apply a low density parity check algorithm to a decoder input to yield an interim decoded output, where the decoder input is a codeword formed of two bit symbols, and where the decoder input is encoded to yield a last layer including at least two different entry values. In addition, the data processing system includes an inverse mapping circuit operable to remap the interim decoded output to yield an overall decoded output.

20 Claims, 5 Drawing Sheets

(56) References Cited

U.S. PATENT DOCUMENTS

| Patent | Date | Name | Ref |
|---|---|---|---|
| 5,550,810 A | 8/1996 | Monogioudis et al. | |
| 5,550,870 A | 8/1996 | Blaker | |
| 5,612,964 A | 3/1997 | Haraszti | |
| 5,710,784 A | 1/1998 | Kindred | |
| 5,717,706 A | 2/1998 | Ikeda | |
| 5,802,118 A | 9/1998 | Bliss | |
| 5,805,795 A * | 9/1998 | Whitten | 714/38.1 |
| 5,844,945 A | 12/1998 | Nam | |
| 5,898,710 A | 4/1999 | Amrany | |
| 5,923,713 A | 7/1999 | Hatakeyama | |
| 5,978,414 A | 11/1999 | Nara | |
| 5,983,383 A | 11/1999 | Wolf | |
| 6,005,897 A | 12/1999 | Mccallister | |
| 6,023,783 A | 2/2000 | Divsalar | |
| 6,029,264 A | 2/2000 | Kobayashi | |
| 6,065,149 A | 5/2000 | Yamanaka | |
| 6,097,764 A | 8/2000 | McCallister | |
| 6,145,110 A | 11/2000 | Khayrallah | |
| 6,216,249 B1 | 4/2001 | Bliss | |
| 6,216,251 B1 | 4/2001 | McGinn | |
| 6,266,795 B1 | 7/2001 | Wei | |
| 6,317,472 B1 | 11/2001 | Choi | |
| 6,351,832 B1 | 2/2002 | Wei | |
| 6,377,610 B1 | 4/2002 | Hagenauer | |
| 6,381,726 B1 | 4/2002 | Weng | |
| 6,412,088 B1 | 6/2002 | Patapoutian et al. | |
| 6,473,878 B1 | 10/2002 | Wei | |
| 6,535,553 B1 | 3/2003 | Limberg et al. | |
| 6,625,775 B1 | 9/2003 | Kim | |
| 6,748,034 B2 | 6/2004 | Hattori | |
| 6,757,862 B1 | 6/2004 | Marianetti, II | |
| 6,785,863 B2 | 8/2004 | Blankenship | |
| 6,810,502 B2 | 10/2004 | Eidson | |
| 6,970,511 B1 | 11/2005 | Barnette | |
| 6,975,692 B2 | 12/2005 | Razzell | |
| 6,986,098 B2 | 1/2006 | Poeppelman | |
| 7,035,327 B2 | 4/2006 | Nakajima et al. | |
| 7,047,474 B2 | 5/2006 | Rhee | |
| 7,058,873 B2 | 6/2006 | Song et al. | |
| 7,073,118 B2 | 7/2006 | Greenberg | |
| 7,093,179 B2 | 8/2006 | Shea | |
| 7,117,427 B2 | 10/2006 | Ophir | |
| 7,133,228 B2 | 11/2006 | Fung | |
| 7,136,244 B1 | 11/2006 | Rothberg | |
| 7,184,486 B1 | 2/2007 | Wu | |
| 7,191,378 B2 | 3/2007 | Eroz | |
| 7,203,887 B2 | 4/2007 | Eroz | |
| 7,237,181 B2 | 6/2007 | Richardson | |
| 7,308,061 B1 | 12/2007 | Huang | |
| 7,310,768 B2 | 12/2007 | Eidson | |
| 7,313,750 B1 | 12/2007 | Feng | |
| 7,370,258 B2 | 5/2008 | Iancu | |
| 7,415,651 B2 | 8/2008 | Argon | |
| 7,502,189 B2 | 3/2009 | Sawaguchi | |
| 7,523,375 B2 | 4/2009 | Spencer | |
| 7,587,657 B2 | 9/2009 | Haratsch | |
| 7,590,168 B2 | 9/2009 | Raghavan | |
| 7,596,196 B1 | 9/2009 | Liu et al. | |
| 7,646,829 B2 | 1/2010 | Ashley | |
| 7,702,986 B2 | 4/2010 | Bjerke | |
| 7,752,523 B1 | 7/2010 | Chaichanavong | |
| 7,779,325 B2 | 8/2010 | Song | |
| 7,802,172 B2 | 9/2010 | Casado | |
| 7,861,134 B2 * | 12/2010 | Kose | 714/755 |
| 7,952,824 B2 | 5/2011 | Dziak | |
| 7,958,425 B2 | 6/2011 | Chugg | |
| 7,996,746 B2 | 8/2011 | Livshitz | |
| 8,018,360 B2 | 9/2011 | Nayak | |
| 8,020,078 B2 | 9/2011 | Richardson | |
| 8,151,161 B2 * | 4/2012 | Cho et al. | 714/752 |
| 8,161,345 B2 * | 4/2012 | Graef | 714/752 |
| 8,161,361 B1 | 4/2012 | Song et al. | |
| 8,201,051 B2 | 6/2012 | Tan | |
| 8,225,168 B2 | 7/2012 | Yu et al. | |
| 8,237,597 B2 | 8/2012 | Liu | |
| 8,261,171 B2 | 9/2012 | Annampedu | |
| 8,291,284 B2 | 10/2012 | Savin | |
| 8,291,285 B1 * | 10/2012 | Varnica et al. | 714/752 |
| 8,291,299 B2 | 10/2012 | Li | |
| 8,295,001 B2 | 10/2012 | Liu | |
| 8,352,846 B2 * | 1/2013 | Lakkis | 714/801 |
| 8,386,880 B2 * | 2/2013 | Savin | 714/752 |
| 8,411,537 B2 * | 4/2013 | Tan et al. | 369/47.14 |
| 8,438,459 B2 * | 5/2013 | Cho et al. | 714/781 |
| 8,499,226 B2 * | 7/2013 | Gunnam | 714/786 |
| 8,516,347 B1 * | 8/2013 | Li et al. | 714/780 |
| 2002/0067780 A1 | 6/2002 | Razzell | |
| 2003/0123364 A1 | 7/2003 | Nakajima et al. | |
| 2003/0147168 A1 | 8/2003 | Galbraith et al. | |
| 2004/0194007 A1 | 9/2004 | Hocevar | |
| 2005/0243456 A1 | 11/2005 | Mitchell et al. | |
| 2005/0268202 A1 * | 12/2005 | Molisch et al. | 714/752 |
| 2006/0002689 A1 | 1/2006 | Yang et al. | |
| 2007/0297496 A1 | 12/2007 | Park et al. | |
| 2008/0037676 A1 | 2/2008 | Kyun et al. | |
| 2008/0069373 A1 | 3/2008 | Jiang | |
| 2008/0304558 A1 | 12/2008 | Zhu et al. | |
| 2009/0132893 A1 | 5/2009 | Miyazaki | |
| 2009/0177852 A1 | 7/2009 | Chen | |
| 2009/0185643 A1 | 7/2009 | Fitzpatrick | |
| 2010/0172046 A1 | 7/2010 | Liu et al. | |
| 2010/0275096 A1 * | 10/2010 | Zhong et al. | 714/758 |
| 2010/0322048 A1 | 12/2010 | Yang et al. | |
| 2011/0167227 A1 | 7/2011 | Yang | |
| 2011/0264987 A1 | 10/2011 | Li | |
| 2011/0320902 A1 * | 12/2011 | Gunnam | 714/752 |
| 2012/0124118 A1 | 5/2012 | Ivkovic | |
| 2012/0182643 A1 | 7/2012 | Zhang | |
| 2012/0207201 A1 | 8/2012 | Xia | |
| 2012/0212849 A1 | 8/2012 | Xu | |
| 2012/0262814 A1 | 10/2012 | Li | |
| 2012/0265488 A1 | 10/2012 | Sun | |

OTHER PUBLICATIONS

Casado et al., Multiple-rate low-density parity-check codes with constant blocklength, IEEE Transations on communications, Jan. 2009, vol. 57, pp. 75-83.

Hagenauer, J. et al A Viterbi Algorithm with Soft-Decision Outputs and its Applications in Proc. IEEE Globecom, pp. 47. 11-47 Dallas, TX Nov. 1989.

Lin et al "An efficient VLSI Architecture for non binary LDPC decoders"—IEEE Transaction on Circuits and Systems II vol. 57, Issue 1 (Jan. 2010) pp. 51-55.

* cited by examiner

SYSTEMS AND METHODS FOR REDUCED CONSTRAINT CODE DATA PROCESSING

CROSS REFERENCE TO RELATED APPLICATION

The present application claims priority to U.S. patent application Ser. No. 61/804,264 entitled "Systems and Methods for Reduced Constraint Code Data Processing" and filed on Mar. 22, 2013 by Li et al. The entirety of each of the aforementioned reference is incorporated herein by reference for all purposes.

FIELD OF THE INVENTION

The present inventions are related to systems and methods for data processing, and more particularly to systems and methods for performing data encoding and/or decoding.

BACKGROUND

Various data processing systems have been developed including storage systems, cellular telephone systems, and radio transmission systems. In such systems data is transferred from a sender to a receiver via some medium. For example, in a storage system, data is sent from a sender (i.e., a write function) to a receiver (i.e., a read function) via a storage medium. As information is stored and transmitted in the form of digital data, errors are introduced that, if not corrected, can corrupt the data and render the information unusable. Data processing typically relies on transferring an encoded data set via a medium, and decoding the received encoded data set to recover the original data. In some cases, the encoding and decoding results in a mis-correction situation where the original data is not recovered, but the decoding is not correct.

Hence, for at least the aforementioned reasons, there exists a need in the art for advanced systems and methods for data encoding and/or decoding.

BRIEF SUMMARY

The present inventions are related to systems and methods for data processing, and more particularly to systems and methods for performing data encoding and/or decoding.

Various embodiments of the present invention provide data processing systems that include a decoder circuit and an inverse mapping circuit. The decoder circuit is operable to apply a low density parity check algorithm to a decoder input to yield an interim decoded output. The decoder input is encoded to yield a last layer including at least two different entry values. The inverse mapping circuit is operable to remap the interim decoded output to yield an overall decoded output.

This summary provides only a general outline of some embodiments of the invention. The phrases "in one embodiment," "according to one embodiment," "in various embodiments", "in one or more embodiments", "in particular embodiments" and the like generally mean the particular feature, structure, or characteristic following the phrase is included in at least one embodiment of the present invention, and may be included in more than one embodiment of the present invention. Importantly, such phases do not necessarily refer to the same embodiment. Many other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

Figure 1:
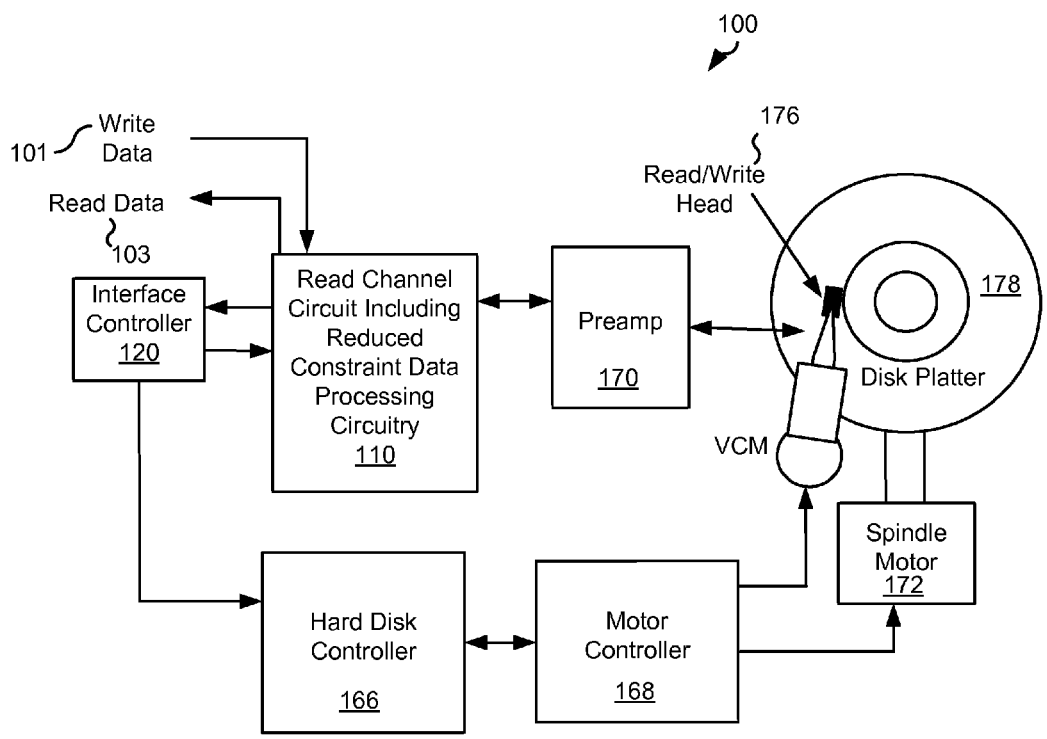
FIG. 1 shows a storage system including a read channel circuit having reduced constraint data processing circuitry in accordance with various embodiments of the present invention.

The present inventions are related to systems and methods for data processing, and more particularly to systems and methods for performing data encoding and/or decoding.

Various embodiments of the present invention provide for reduced constraint low density parity check decoding. The constraint reduction results in an increase in a minimal binary hamming distance when compared with previously constrained codes that reduces the possibility of mis-correction (i.e., obtaining a decoded result where all parity check equations are correct, but the data is not the originally written data set). In some embodiments of the present invention, the reduced constraint allows for more than one entry value in the last layer of a codeword designed for decoding using the reduced constraint low density parity check decoding. Some embodiments of the present invention utilize an inverse entry mapping circuit that remaps a soft data output to accommodate the multiple allowed entry values in the last layer of the processed codeword.

Various embodiments of the present invention provide data processing systems that include a decoder circuit and an inverse mapping circuit. The decoder circuit is operable to apply a low density parity check algorithm to a decoder input to yield an interim decoded output. The decoder input is encoded to yield a last layer including at least two different entry values. The inverse mapping circuit is operable to remap the interim decoded output to yield an overall decoded output. In some instances of the aforementioned embodiments, the data processing systems are implemented as an integrated circuit. Such data processing systems may be incorporated a storage device, or a data transmission device. In some instances of the aforementioned embodiments, the decoder input is a codeword formed of two bit symbols selected from 01, 10, or 11. In one or more instances of the aforementioned embodiments, the systems further include a data detector circuit operable to apply a data detection algorithm to a data input to yield a detected output, The decoder input is derived from the detected output.

In various instances of the present invention, the last layer includes a plurality of shift instructions each associated with one of the at least two different entry values. In some such cases, the plurality of shift instructions each indicate a zero shift. In one or more instances of the aforementioned embodiments, the the plurality of shift instructions is a first plurality of shift instructions, and the decoder input further includes a preceding layer including a second plurality of shift instructions. In some such cases, the first plurality of shift instructions each indicate a zero shift, and at least one of the second plurality of shift instructions indicates a non-zero shift.

Other embodiments of the present invention provide methods for data processing that include: receiving a decoder input that is encoded to yield a last layer including at least two different entry values; applying a low density parity check algorithm to the decoder input using a decoder circuit to yield an interim decoded output; and an inverse mapping circuit operable to remap the interim decoded output to yield an overall decoded output.

Turning to FIG. 1, a storage system 100 including a read channel circuit 110 having reduced constraint data processing circuitry in accordance with various embodiments of the present invention. Storage system 100 may be, for example, a hard disk drive. Storage system 100 also includes a preamplifier 170, an interface controller 120, a hard disk controller 166, a motor controller 168, a spindle motor 172, a disk platter 178, and a read/write head 176. Interface controller 120 controls addressing and timing of data to/from disk platter 178. The data on disk platter 178 consists of groups of magnetic signals that may be detected by read/write head assembly 176 when the assembly is properly positioned over disk platter 178. In one embodiment, disk platter 178 includes magnetic signals recorded in accordance with either a longitudinal or a perpendicular recording scheme.

In a typical read operation, read/write head assembly 176 is accurately positioned by motor controller 168 over a desired data track on disk platter 178. Motor controller 168 both positions read/write head assembly 176 in relation to disk platter 178 and drives spindle motor 172 by moving read/write head assembly to the proper data track on disk platter 178 under the direction of hard disk controller 166. Spindle motor 172 spins disk platter 178 at a determined spin rate (RPMs). Once read/write head assembly 176 is positioned adjacent the proper data track, magnetic signals representing data on disk platter 178 are sensed by read/write head assembly 176 as disk platter 178 is rotated by spindle motor 172. The sensed magnetic signals are provided as a continuous, minute analog signal representative of the magnetic data on disk platter 178. This minute analog signal is transferred from read/write head assembly 176 to read channel circuit 110 via preamplifier 170. Preamplifier 170 is operable to amplify the minute analog signals accessed from disk platter 178. In turn, read channel circuit 110 decodes and digitizes the received analog signal to recreate the information originally written to disk platter 178. This data is provided as read data 103 to a receiving circuit. A write operation is substantially the opposite of the preceding read operation with write data 101 being provided to read channel circuit 110. This data is then encoded and written to disk platter 178.

As part of processing the received information, read channel circuit 110 receives a reduced constraint codeword that is encoded without requiring a '1' symbol in the final circulant in the codeword. Such encoding requires additional decoding circuitry, but increases the minimal distance in the codeword to reduce the possibility of mis-correction. In some cases, read channel circuit 110 may be implemented to include a data processing circuit similar to that discussed below in relation to FIG. 3. The reduced constraint low density parity check decoder circuit may be implemented similar to that discussed below in relation to FIG. 4. The data processing circuit may operate similar to that discussed below in relation to FIGS. 5a-5b.

It should be noted that storage system 100 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such as storage system 100, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

A data decoder circuit used in relation to read channel circuit 110 may be, but is not limited to, a low density parity check (LDPC) decoder circuit as are known in the art. Such low density parity check technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

In addition, it should be noted that storage system 100 may be modified to include solid state memory that is used to store data in addition to the storage offered by disk platter 178. This solid state memory may be used in parallel to disk platter 178 to provide additional storage. In such a case, the solid state memory receives and provides information directly to read channel circuit 110. Alternatively, the solid state memory may be used as a cache where it offers faster access time than that offered by disk platted 178. In such a case, the solid state memory may be disposed between interface controller 120 and read channel circuit 110 where it operates as a pass through to disk platter 178 when requested data is not available in the solid state memory or when the solid state memory does not have sufficient storage to hold a newly written data set. Based upon the disclosure provided herein, one of ordinary skill in the art will recognize a variety of storage systems including both disk platter 178 and a solid state memory.

Figure 2:
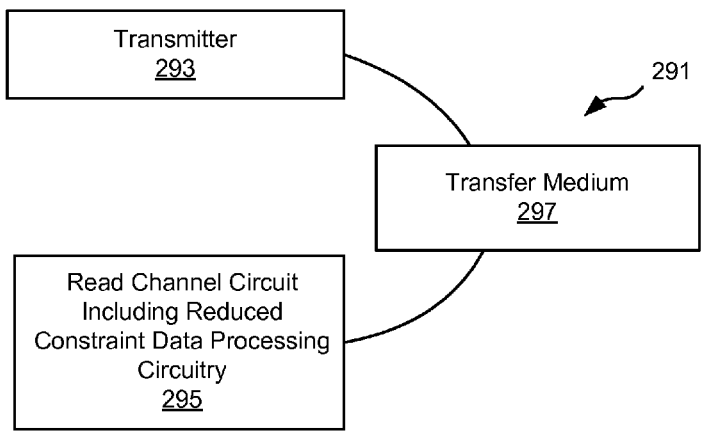
FIG. 2 depicts a data transmission system including a receiver having reduced constraint data processing circuitry in accordance with one or more embodiments of the present invention.

Turning to FIG. 2, a data transmission system 291 including a receiver 295 having reduced constraint data processing circuitry in accordance with one or more embodiments of the present invention. Data transmission system 291 includes a transmitter 293 that is operable to transmit encoded information via a transfer medium 297 as is known in the art. The encoded data is received from transfer medium 297 by a receiver 295. Receiver 295 processes the received input to yield the originally transmitted data.

As part of processing the received information, receiver 295 receives a reduced constraint codeword that is encoded without requiring a '1' symbol in the final circulant in the codeword. Such encoding requires additional decoding circuitry, but increases the minimal distance in the codeword to reduce the possibility of mis-correction. In some cases, receiver 295 may be implemented to include a data processing circuit similar to that discussed below in relation to FIG. 3. The reduced constraint low density parity check decoder circuit may be implemented similar to that discussed below in relation to FIG. 4. The data processing circuit may operate similar to that discussed below in relation to FIGS. 5a-5b.

Figure 3:
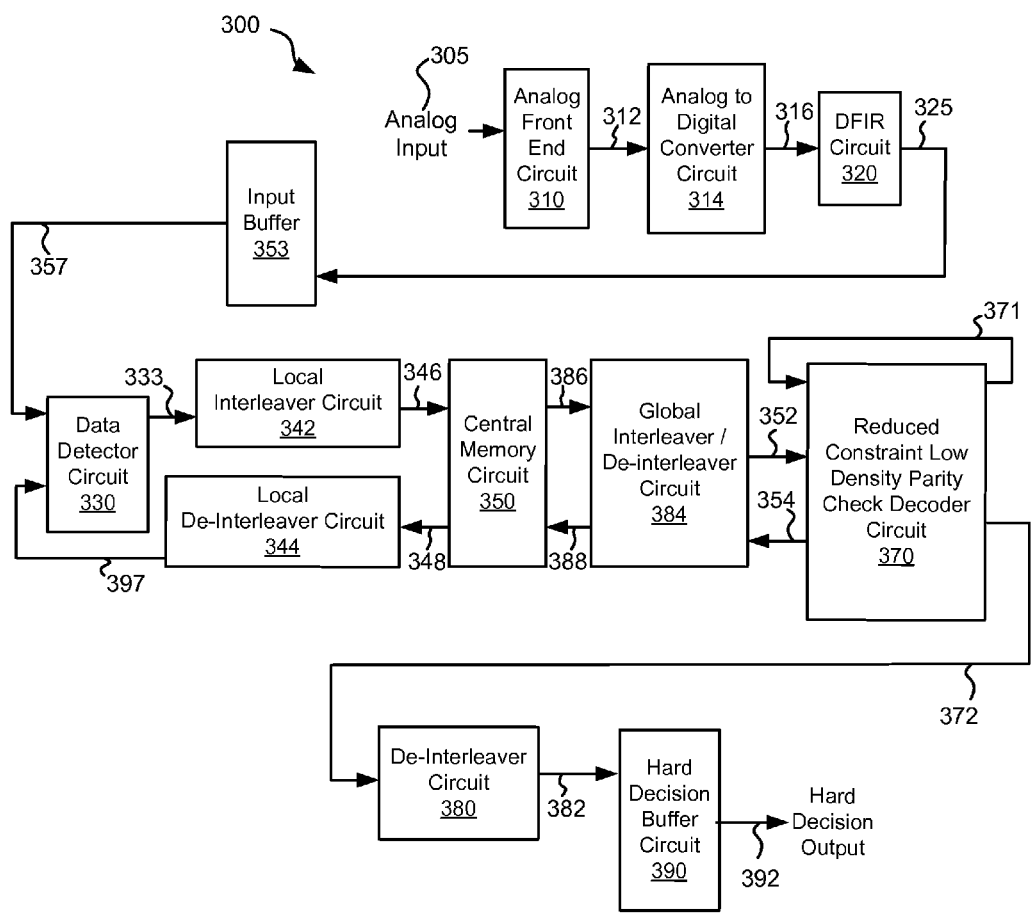
FIG. 3 shows a data processing circuit including a reduced constraint low density parity check decoder circuit in accordance with some embodiments of the present invention.

FIG. 3 shows a data processing circuit 300 including a reduced constraint low density parity check decoder circuit 370 in accordance with some embodiments of the present invention. Data processing circuit 300 includes an analog front end circuit 310 that receives an analog signal 305. Analog front end circuit 310 processes analog signal 305 and provides a processed analog signal 312 to an analog to digital converter circuit 314. Analog front end circuit 310 may include, but is not limited to, an analog filter and an amplifier circuit as are known in the art. Based upon the disclosure provided herein, one of ordinary skill in the art will recognize a variety of circuitry that may be included as part of analog front end circuit 310. In some cases, analog signal 305 is derived from a read/write head assembly (not shown) that is disposed in relation to a storage medium (not shown). In other cases, analog signal 305 is derived from a receiver circuit (not shown) that is operable to receive a signal from a transmission medium (not shown). The transmission medium may be wired or wireless. Based upon the disclosure provided herein, one of ordinary skill in the art will recognize a variety of source from which analog input 305 may be derived.

Analog to digital converter circuit 314 converts processed analog signal 312 into a corresponding series of digital samples 316. Analog to digital converter circuit 314 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 316 are provided to an equalizer circuit 320. Equalizer circuit 320 applies an equalization algorithm to digital samples 316 to yield an equalized output 325. In some embodiments of the present invention, equalizer circuit 320 is a digital finite impulse response filter circuit as are known in the art. It may be possible that equalized output 325 may be received directly from a storage device in, for example, a solid state storage system. In such cases, analog front end circuit 310, analog to digital converter circuit 314 and equalizer circuit 320 may be eliminated where the data is received as a digital data input. Equalized output 325 is stored to an input buffer 353 that includes sufficient memory to maintain a number of codewords until processing of that codeword is completed through a data detector circuit 330 and reduced constraint low density parity check decoder circuit 370 including, where warranted, multiple global iterations (passes through both data detector circuit 330 and layered decoder and non-layered reuse circuitry 370) and/or local iterations (passes through layered decoder and non-layered reuse circuitry 370 during a given global iteration). An output 357 is provided to data detector circuit 330.

Data detector circuit 330 may be a single data detector circuit or may be two or more data detector circuits operating in parallel on different codewords. Whether it is a single data detector circuit or a number of data detector circuits operating in parallel, data detector circuit 330 is operable to apply a data detection algorithm to a received codeword or data set. In some embodiments of the present invention, data detector circuit 330 is a Viterbi algorithm data detector circuit as are known in the art. In other embodiments of the present invention, data detector circuit 330 is a maximum a posteriori data detector circuit as are known in the art. Of note, the general phrases "Viterbi data detection algorithm" or "Viterbi algorithm data detector circuit" are used in their broadest sense to mean any Viterbi detection algorithm or Viterbi algorithm detector circuit or variations thereof including, but not limited to, bi-direction Viterbi detection algorithm or bi-direction Viterbi algorithm detector circuit. Also, the general phrases "maximum a posteriori data detection algorithm" or "maximum a posteriori data detector circuit" are used in their broadest sense to mean any maximum a posteriori detection algorithm or detector circuit or variations thereof including, but not limited to, simplified maximum a posteriori data detection algorithm and a max-log maximum a posteriori data detection algorithm, or corresponding detector circuits. Based upon the disclosure provided herein, one of ordinary skill in the art will recognize a variety of data detector circuits that may be used in relation to different embodiments of the present invention. In some cases, one data detector circuit included in data detector circuit 330 is used to apply the data detection algorithm to the received codeword for a first global iteration applied to the received codeword, and another data detector circuit included in data detector circuit 330 is operable apply the data detection algorithm to the received codeword guided by a decoded output accessed from a central memory circuit 350 on subsequent global iterations.

Upon completion of application of the data detection algorithm to the received codeword on the first global iteration, data detector circuit 330 provides a detector output 333. Detector output 333 includes soft data. As used herein, the phrase "soft data" is used in its broadest sense to mean reliability data with each instance of the reliability data indicating a likelihood that a corresponding bit position or group of bit positions has been correctly detected. In some embodiments of the present invention, the soft data or reliability data is log likelihood ratio data as is known in the art. Detector output 333 is provided to a local interleaver circuit 342. Local interleaver circuit 342 is operable to shuffle sub-portions (i.e., local chunks) of the data set included as detected output and provides an interleaved codeword 346 that is stored to central memory circuit 350. Interleaver circuit 342 may be any circuit known in the art that is capable of shuffling data sets to yield a re-arranged data set. Interleaved codeword 346 is stored to central memory circuit 350.

Once reduced constraint low density parity check decoder circuit 370 is available, a previously stored interleaved codeword 346 is accessed from central memory circuit 350 as a stored codeword 386 and globally interleaved by a global interleaver/de-interleaver circuit 384. Global interleaver/de-interleaver circuit 384 may be any circuit known in the art that is capable of globally rearranging codewords. Global interleaver/De-interleaver circuit 384 provides a decoder input 352 into reduced constraint low density parity check decoder circuit 370. In some embodiments of the present invention, the data decode algorithm is a layered low density parity check algorithm as are known in the art. In other embodiments of the present invention, the data decode algorithm is a non-layered low density parity check algorithm as are known in the art.

Where decoded output 371 fails to converge (i.e., fails to yield the originally written data set) and a number of local iterations through layered decoder and non-layered reuse circuitry 370 exceeds a threshold, the resulting decoded output is provided as a decoded output 354 back to central memory circuit 350 where it is stored awaiting another global iteration through a data detector circuit included in data detector circuit 330. Prior to storage of decoded output 354 to central memory circuit 350, decoded output 354 is globally de-interleaved to yield a globally de-interleaved output 388 that is stored to central memory circuit 350. The global de-interleaving reverses the global interleaving earlier applied to stored codeword 386 to yield decoder input 352. When a data detector circuit included in data detector circuit 330 becomes available, a previously stored de-interleaved output 388 is accessed from central memory circuit 350 and locally de-interleaved by a de-interleaver circuit 344. De-interleaver circuit 344 re-arranges decoder output 348 to reverse the shuffling originally performed by interleaver circuit 342. A resulting de-interleaved output 397 is provided to data detector circuit 330 where it is used to guide subsequent detection of a corresponding data set previously received as equalized output 325.

Alternatively, where the decoded output converges (i.e., yields the originally written data set), the resulting decoded output is provided as an output codeword 372 to a de-interleaver circuit 380 that rearranges the data to reverse both the global and local interleaving applied to the data to yield a de-interleaved output 382. De-interleaved output 382 is provided to a hard decision buffer circuit 390 that arranges the received codeword along with other previously received codewords in an order expected by a requesting host processor. The resulting output is provided as a hard decision output 392.

Reduced constraint low density parity check decoder circuit 370 is designed to accept codewords that are not constrained by a '1' symbol in the final circulant in the codeword. This is facilitated by using a standard non-binary, low density parity check decoder circuit that is augmented to include an inverse mapping circuit to adjust a soft data output to compensate for the non-constrained circulant. Such an approach utilizes only a relatively small amount of additional circuitry, but results in an increased distance between possible accepted decoded outputs thereby reducing the likelihood of a mis-correction. One example implementation of reduced constraint low density parity check decoder circuit 370 is described below in relation to FIG. 4 below.

Figure 4:
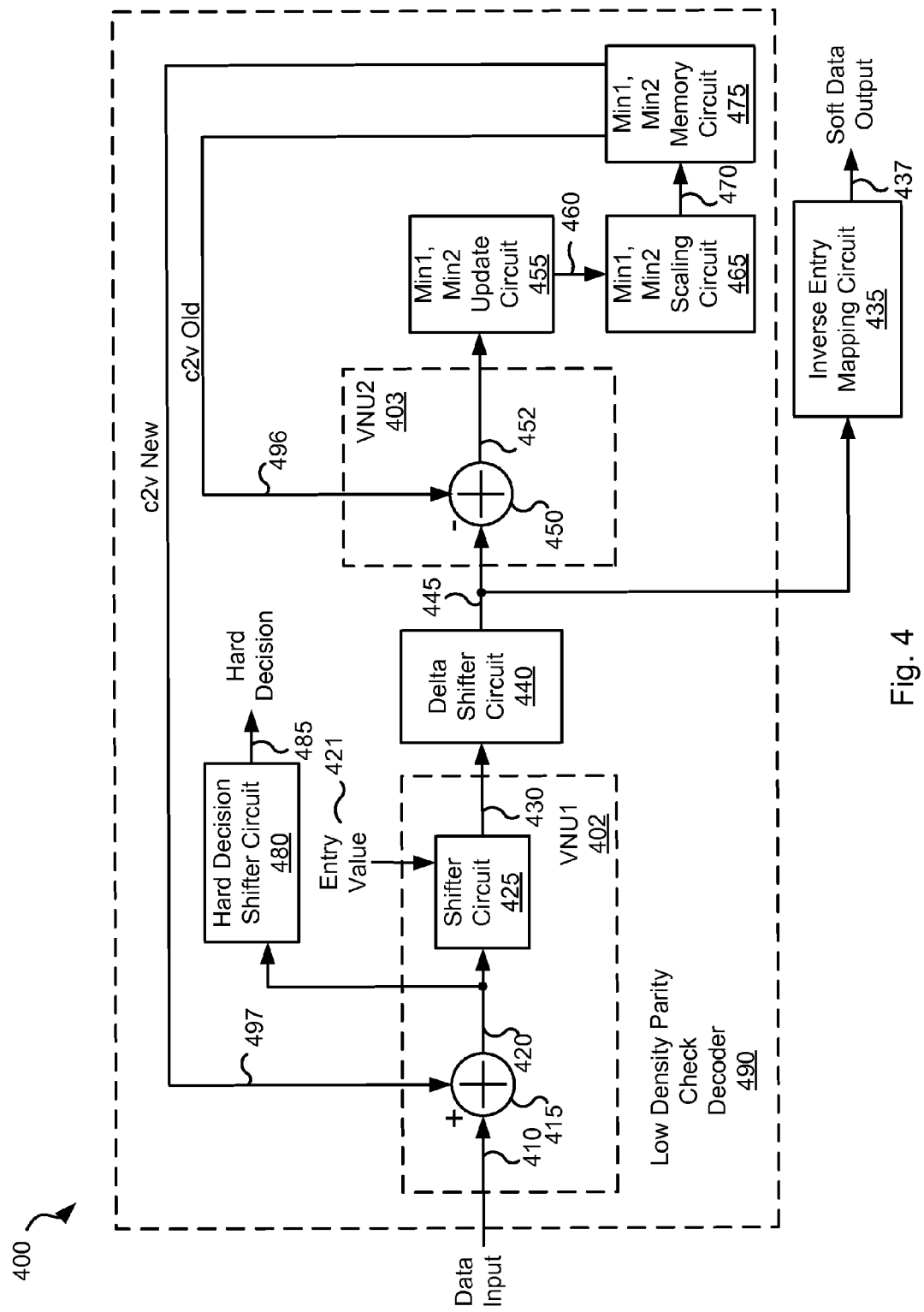
FIG. 4 shows an example implementation of a reduced constraint low density parity check decoder circuit in accordance with one or more embodiments of the present invention.

Turning to FIG. 4, an example implementation of a reduced constraint low density parity check decoder circuit 400 in accordance with one or more embodiments of the present invention. Reduced constraint low density parity check decoder circuit 400 may be used in place of reduced constraint low density parity check decoder circuit 370. Where reduced constraint low density parity check decoder circuit 400 is used in place of reduced constraint low density parity check decoder circuit 370, decoder input 352 is provided as a data input 410, and the combination of a soft data output 437 and a hard decision output 485 being provided as decoder output 371.

Reduced constraint low density parity check decoder circuit 400 includes a standard low density parity check decoder circuit 490 that includes both a variable node unit 402 and a variable node unit 403. Of note, standard low density parity check decoder circuit 490 is shown in a simplified form, and one of ordinary skill in the art will appreciate a variety of normalization, padding, and other circuitry that can be included in a standard low density parity check decoder circuit.

Variable node unit 402 includes a summation circuit 415 and a shifter circuit 425. Summation circuit 415 is operable to add a new c2v (i.e., check node to variable node) message 497 to data input 415 to yield a first sum 420. First sum 420 is provided to shifter circuit 425 that shifts first sum 420 in accordance with an entry value 421 (i.e., an i, j, or k for a two bit symbol system) received as part of a decoder input, and data input 410. The following provides an example of first sum 420 and entry value 421 of three consecutive circulants where a ninety-six symbol circulant sizes is used:

[96a] 89k, 3i, 41j, 0j, 47j, 14j, 6k, 30j, 1k, 7k, 86k, 38i, 60k, 65k, 79k, 15k, 95j, 78j, 59i, 58i, 26k, 55k, 32i, 2i, 67j, 35j, 85j, 21i

[96b] 19k, 5i, 36k, 78j, 72j, 75k, 47k, 79j, 22k, 57j, 95i, 39k, 2k, 58i, 65i, 68i, 13j, 38k, 27j, 45k, 37j, 83i, 6k, 92j, 11j, 26i, 48j, 50j

[96c] 0k, 0i, 0i, 0k, 0j, 0k, 0k, 0j, 0i, 0i, 0j, 0k, 0i, 0i, 0k, 0j, 0i, 0j, 0i, 0k, 0j, 0j, 0j, 0i, 0k, 0k, 0j, 0j

The preceding elements of the codewords indicate a number of shifts to the right of an identity circulant (i.e., the numbered portion) and a selection of which two bit symbol (i.e., the lettered portion). Thus, 89k indicates a shift of 89 symbols to the right of the identity circulant, and selection of the '11' symbol (i.e., k). The following 3i indicates a shift of 3 symbols to the right of the identity circulant, and selection of the '01' symbol (i.e., i). The following 41j indicates a shift of 41 symbols to the right of the identity circulant, and selection of the '10' symbol (i.e., j). The other elements represent similar shifts and selections. After the shifting, the entry value (either i, j or k) is entered along the diagonal of the circulant, and the result is provided as a shifted output 430. Of note, the last layer ([96c]) of ninety-six symbols do not require a shift (i.e., all have a shift value of 0), but are not constrained to include a common entry value 421. Rather, entry values 421 for the last layer may be either i (one), j (two) or k (three). This is a departure from the prior art where the last layer was constrained to have only a single entry value i (one). First sum 420 is also provided to a hard decision shifter circuit 480 that operates to shift the received data input to yield hard decision output 485.

The prior art code constraint using only a single entry value in the last layer resulted in a minimal binary hamming distance of twelve (12). In contrast, a reduced constraint code allowing for a combination of i (one), j (two) or k (three) in the last layer in accordance with some embodiments of the present invention results in a minimal binary hamming distance of fourteen (14). This increase in the minimal binary hamming distance reduces the possibility of mis-corrections (i.e., obtaining a decoded result where all parity check equations are correct, but the data is not the originally written data set).

Shifted output 430 is provided to a delta shifter circuit 440 that is operable to shift shifted output 430 to match a subsequent layer. Thus, for example, the first symbol of layer [96a] results in a right shift of the identity circulant by 89 symbols provided as shifted output, and the first symbol of the next layer [96b] calls for a right shift of the identity circulant by 19 symbols, or a delta of negative seventy (i.e., 19−89=−70). In this case, delta shifter circuit 440 shifts shifted output 430 to the left by 70 symbols (left shift is negative) to yield a delta shifted output 445.

Delta shifted output 445 is provided to a summation circuit 450 of variable node unit 403 where it is subtracted from an old c2v (i.e., check node to variable node) message 496 to yield a second sum 452. Second sum 452 is provided to a min 1, min 2 update circuit 455. Min 1, min 2 update circuit 455 selects the minimum distance (i.e., min 1) and the next minimum distance (i.e., min 2) to the next trellis node. Min 1, min 2 update circuit 455 may be any circuit known in the art for generating the first and second minimum distance values. Based upon the disclosure provided herein, one of ordinary skill in the art will recognize a variety of implementations of min 1, min 2 update circuit 455 that may be used in relation to different embodiments of the present invention.

Min 1, min 2 update circuit 455 provides the generated min 1 and min 2 values as an output 460 to a min 1, min 2 scaling circuit 465. Min 1, min 2 scaling circuit 465 scales output 460 to yield scaled mini, min 2 values 470 that are provided to a min 1, min 2 memory circuit 475. Min 1, min 2 scaling circuit 465 may be any circuit known in the art that is capable of applying a scalar to a received value to yield a scaled value. In one particular embodiment of the present invention, min 1, min 2 scaling circuit 465 is a multiplier circuit. Min 1, min 2 memory circuit 475 retains a previous instances of scaled min 1, min 2 values 470 as c2v old message 496, and the current instance of scaled min 1, min 2 values 475 as c2v new message 497.

Delta shifted output 445 is also provided to an inverse entry mapping circuit 435 that operates to accommodate the lack of constraint in the last layer ([96c]) of ninety-six symbols. In particular, by allowing the entry values in the last layer to vary, inverse entry mapping circuit 435 is operable to remap the soft data outputs represented by delta shifted output 445 to yield soft data output 437.

The inverse entry mapping applied by inverse entry mapping circuit 435 shifts both the sign and the amplitude of the soft data. In some cases, the soft data is log likelihood ratio data. The soft data in delta shifted output 445 is represented as {sv, [v1, v2, v3]}, where sv corresponds to the hard decision (i.e., entry value 421), and v1, v2, v3 correspond to the log likelihood ratio (i.e., likelihood) of each of the non-selected hard decision values. Thus, for example, where sv is '00', v1 corresponds to the log likelihood ratio of '01', v2 corresponds to the log likelihood ratio of '10', and v3 corresponds to the log likelihood ratio of '11'; where sv is '01', v1 corresponds to the log likelihood ratio of '00', v2 corresponds to the log likelihood ratio of '10', and v3 corresponds to the log likelihood ratio of '11'; where sv is '10', v1 corresponds to the log likelihood ratio of '00', v2 corresponds to the log likelihood ratio of '01', and v3 corresponds to the log likelihood ratio of '11'; and where sv is '11', v1 corresponds to the log likelihood ratio of '00', v2 corresponds to the log likelihood ratio of '01', and v3 corresponds to the log likelihood ratio of '10'. Of note, while this embodiment is described in relation to use of two-bit symbols, other embodiments may be expanded to accommodate symbols of three or more bits.

Soft data output 437 is represented as [u1, u2, u3] corresponding to a hard decision output 485 su (i.e., {su, [u1, u2, u3]}), where su corresponds to hard decision output 485, and u1, u2, u3 correspond to the log likelihood ratio (i.e., likelihood) of each of the non-selected hard decision values. Thus, for example, where su is '00', u1 corresponds to the log likelihood ratio of '01', u2 corresponds to the log likelihood ratio of '10', and u3 corresponds to the log likelihood ratio of '11'; where su is '01', u1 corresponds to the log likelihood ratio of '00', u2 corresponds to the log likelihood ratio of '10', and u3 corresponds to the log likelihood ratio of '11'; where su is '10', u1 corresponds to the log likelihood ratio of '00', u2 corresponds to the log likelihood ratio of '01', and u3 corresponds to the log likelihood ratio of '11'; and where su is '11', u1 corresponds to the log likelihood ratio of '00', u2 corresponds to the log likelihood ratio of '01', and u3 corresponds to the log likelihood ratio of '10'. Again, while this embodiment is described in relation to use of two-bit symbols, other embodiments may be expanded to accommodate symbols of three or more bits.

Where two bit symbols are accommodated by reduced constraint low density parity check decoder circuit 400, mapping applied by inverse entry mapping circuit 435 is described by the following equations:

$$su = sv(\text{mul})g;$$

$$v1 = u(g);$$

$$v2 = u(2(\text{mul})g); \text{ and}$$

$$v3 = u(3(\text{mul})g),$$

where the functions (mul) and (add) are defined by the following tables:

| (add) | 0 | 1 | 2 | 3 | (mul) | 0 | 1 | 2 | 3 |
|---|---|---|---|---|---|---|---|---|---|
| 0 | 0 | 1 | 2 | 3 | 0 | 0 | 0 | 0 | 0 |
| 1 | 1 | 0 | 3 | 2 | 1 | 0 | 1 | 2 | 3 |
| 2 | 2 | 3 | 0 | 1 | 2 | 0 | 2 | 3 | 1 |
| 3 | 3 | 2 | 1 | 0 | 3 | 0 | 3 | 1 | 2 |

Thus, for example, 0 (add) 0 is 0, 2 (add) 3 is 1, 3 (mul) 1 is 3, and 2 (mul) 3 is 2. Thus, where delta shifted value 445 includes a g=2 with {sv, [v1, v2, v3]} of {1, [3, 9, 12]}, inverse entry mapping circuit 435 maps it to {su, [u1, u2, u3]} of {2, [12, 3, 9]} (i.e., v1 mapped to u2, v2 mapped to u3, and v3 mapped to u1.

Figure 5A:
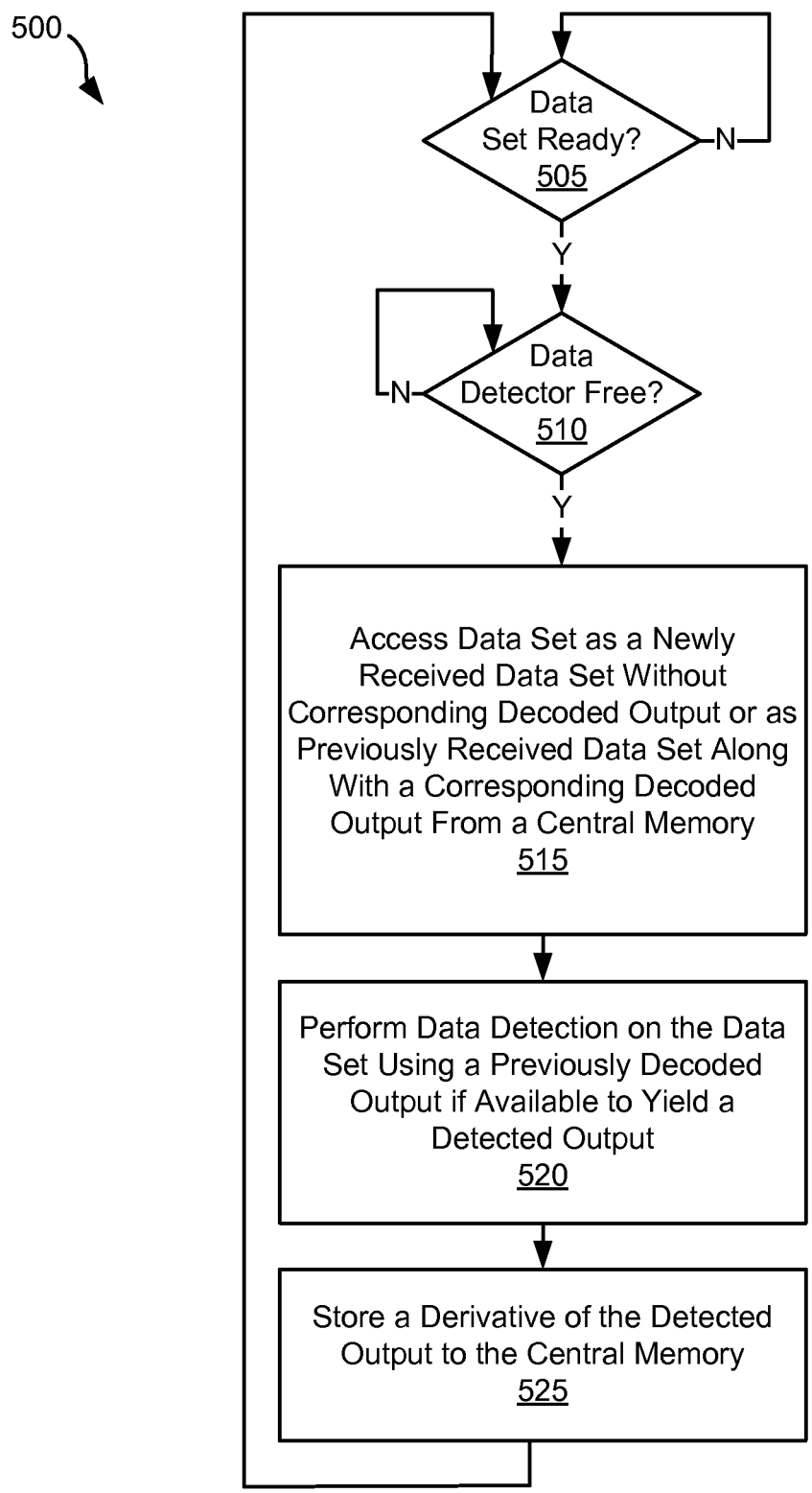
FIGS. 5a-5b are flow diagrams showing a method for performing reduced constraint data decoding in accordance with one or more embodiments of the present invention.

Turning to FIG. 5a, a flow diagram 500 shows a method for data processing that may be used in relation to one or more embodiments of the present invention. Following flow diagram 500, it is determined whether a data set or codeword is ready for application of a data detection algorithm (block 505). In some cases, a data set is ready when it is received from a data decoder circuit via a central memory circuit. In other cases, a data set is ready for processing when it is first made available from a front end processing circuit. Where a data set is ready (block 505), it is determined whether a data detector circuit is available to process the data set (block 510).

Where the data detector circuit is available for processing (block 510), the data set is accessed by the available data detector circuit (block 515). The data detector circuit may be, for example, a Viterbi algorithm data detector circuit or a maximum a posteriori data detector circuit. Where the data set is a newly received data set (i.e., a first global iteration), the newly received data set is accessed. In contrast, where the data set is a previously received data set (i.e., for the second or later global iterations), both the previously received data set and the corresponding decode data available from a preceding global iteration (available from a central memory) is accessed. The accessed data set is then processed by application of a data detection algorithm to the data set (block 520). Where the data set is a newly received data set (i.e., a first global iteration), it is processed without guidance from decode data available from a data decoder circuit. Alternatively, where the data set is a previously received data set (i.e., for the second or later global iterations), it is processed with guidance of corresponding decode data available from preceding global iterations. Application of the data detection algorithm yields a detected output. A derivative of the detected output is stored to the central memory (block 525). The derivative of the detected output may be, for example, an interleaved or shuffled version of the detected output.

Figure 5B:
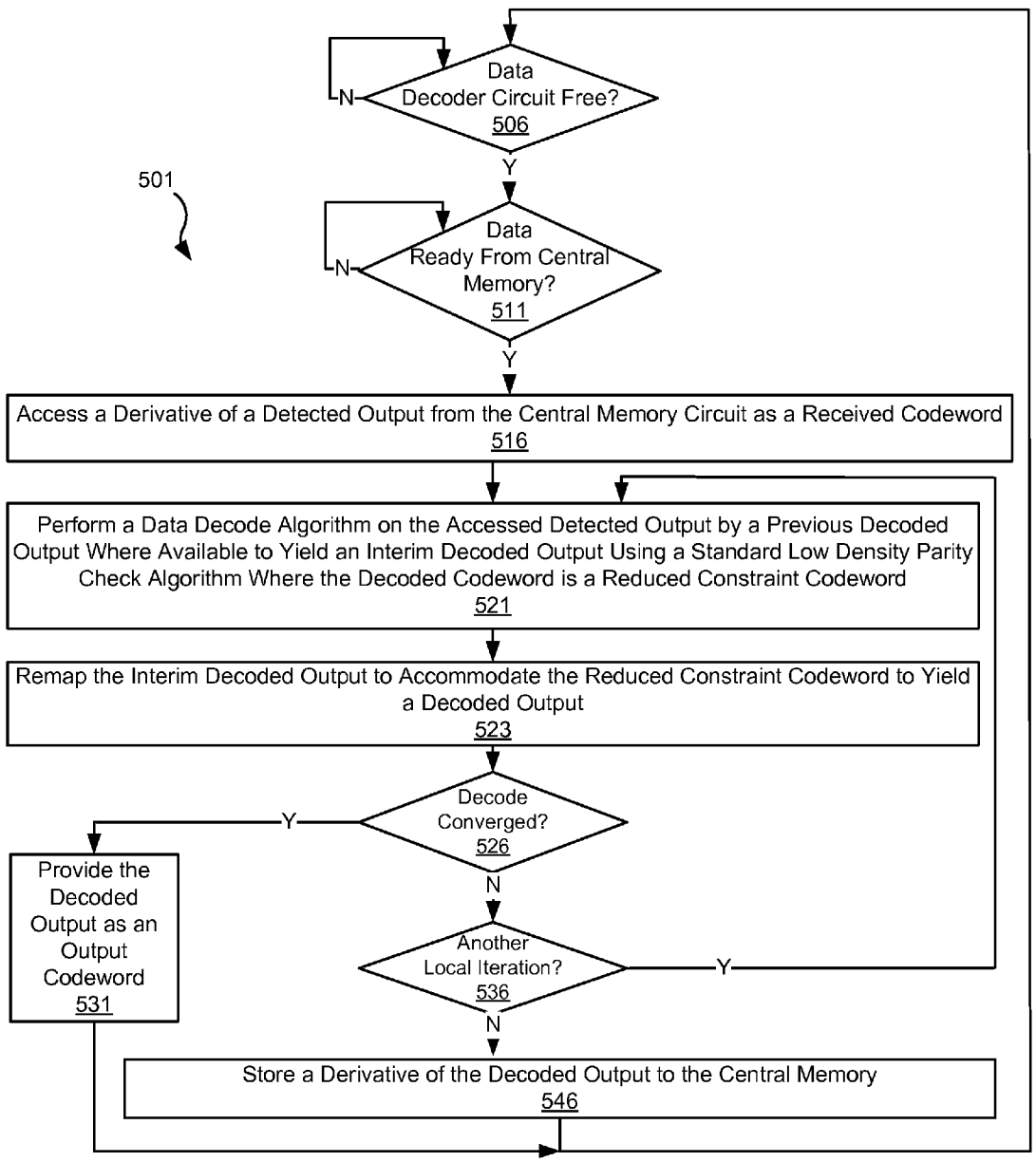

Turning to FIG. 5b, a flow diagram 501 shows a counterpart of the method described above in relation to FIG. 5a. Following flow diagram 501, in parallel to the previously described data detection process of FIG. 5a, it is determined whether a data decoder circuit is available (block 506). The data decoder circuit is a reduced constraint low density data decoder circuit in accordance with one or more embodiments of the present invention. Where the data decoder circuit is available (block 506), it is determined whether a derivative of a detected output is available for processing in the central memory (block 511). Where such a data set is ready (block 511), the previously stored derivative of a detected output is accessed from the central memory and used as a received codeword (block 516). A standard low density parity check algorithm is applied to the received codeword to yield an interim decoded output (block 521). The received codeword is a reduced constraint codeword in accordance with various embodiments of the present invention. This reduced constraint codeword allows for multiple entry values in the last layer of the processed codeword. The constraint reduction results in an increase in a minimal binary hamming distance when compared with previously constrained codes that reduces the possibility of mis-correction (i.e., obtaining a decoded result where all parity check equations are correct, but the data is not the originally written data set). Where a previous local iteration has been performed on the received codeword, the results of the previous local iteration (i.e., a previous decoded output) are used to guide application of the decode algorithm.

The interim decoded output is remapped to accommodate the reduced constraint codeword to yield a decoded output (block 523). This remapping modifies the previously applied standard low density parity check algorithm to accommodate the reduced constraint codeword. In particular, the remapping maps interim output $\{sv, [v1, v2, v3]\}$ to decoded output $\{su, [u1, u2, u3]\}$. In the aforementioned representation, sv corresponds to the hard decision output, and v1, v2, v3 correspond to the log likelihood ratio (i.e., likelihood) of each of the non-selected hard decision values. Thus, for example, where sv is '00', v1 corresponds to the log likelihood ratio of '01', v2 corresponds to the log likelihood ratio of '10', and v3 corresponds to the log likelihood ratio of '11'; where sv is '01', v1 corresponds to the log likelihood ratio of '00', v2 corresponds to the log likelihood ratio of '10', and v3 corresponds to the log likelihood ratio of '11'; where sv is '10', v1 corresponds to the log likelihood ratio of '00', v2 corresponds to the log likelihood ratio of '01', and v3 corresponds to the log likelihood ratio of '11'; and where sv is '11', v1 corresponds to the log likelihood ratio of '00', v2 corresponds to the log likelihood ratio of '01', and v3 corresponds to the log likelihood ratio of '10'. Of note, while this embodiment is described in relation to use of two-bit symbols, other embodiments may be expanded to accommodate symbols of three or more bits. Similarly, su corresponds to the hard decision output, and u1, u2, u3 correspond to the log likelihood ratio (i.e., likelihood) of each of the non-selected hard decision values. Thus, for example, where su is '00', u1 corresponds to the log likelihood ratio of '01', u2 corresponds to the log likelihood ratio of '10', and u3 corresponds to the log likelihood ratio of '11'; where su is '01', u1 corresponds to the log likelihood ratio of '00', u2 corresponds to the log likelihood ratio of '10', and u3 corresponds to the log likelihood ratio of '11'; where su is '10', u1 corresponds to the log likelihood ratio of '00', u2 corresponds to the log likelihood ratio of '01', and u3 corresponds to the log likelihood ratio of '11'; and where su is '11', u1 corresponds to the log likelihood ratio of '00', u2 corresponds to the log likelihood ratio of '01', and u3 corresponds to the log likelihood ratio of '10'. Again, while this embodiment is described in relation to use of two-bit symbols, other embodiments may be expanded to accommodate symbols of three or more bits.

Where two bit symbols are processed by the reduced constraint low density parity check decoder circuit, the is described by the following equations:

$$su=sv(\text{mul})g;$$

$$v1=u(g);$$

$$v2=u(2(\text{mul})g));\text{ and}$$

$$v3=u(3(\text{mul})g)),$$

where the functions (mul) and (add) are defined by the following tables:

| (add) | 0 | 1 | 2 | 3 | (mul) | 0 | 1 | 2 | 3 |
|---|---|---|---|---|---|---|---|---|---|
| 0 | 0 | 1 | 2 | 3 | 0 | 0 | 0 | 0 | 0 |
| 1 | 1 | 0 | 3 | 2 | 1 | 0 | 1 | 2 | 3 |
| 2 | 2 | 3 | 0 | 1 | 2 | 0 | 2 | 3 | 1 |
| 3 | 3 | 2 | 1 | 0 | 3 | 0 | 3 | 1 | 2 |

Thus, for example, 0 (add) 0 is 0, 2 (add) 3 is 1, 3 (mul) 1 is 3, and 2 (mul) 3 is 2. Thus, where delta shifted value 445 includes a g=2 with $\{sv, [v1, v2, v3]\}$ of $\{1, [3, 9, 12]\}$, the remapping maps it to $\{su, [u1, u2, u3]\}$ of $\{2, [12, 3, 9]\}$ (i.e., v1 mapped to u2, v2 mapped to u3, and v3 mapped to u1.

It is then determined whether the decoded output converged (i.e., resulted in the originally written data) (block 526). Where the decoded output converged (block 526), it is provided as an output codeword (block 531). Alternatively, where the decoded output failed to converge (block 526), it is determined whether another local iteration is desired (block 536). In some cases, four local iterations are allowed per each global iteration. Based upon the disclosure provided herein, one of ordinary skill in the art will recognize another number of local iterations that may be used in relation to different embodiments of the present invention. Where another local iteration is desired (block 536), the processes of blocks 506-536 are repeated for the codeword. Alternatively, where another local iteration is not desired (block 536), a derivative of the decoded output is stored to the central memory (block 546). The derivative of the decoded output being stored to the central memory triggers the data set ready query of block 505 to begin the data detection process.

It should be noted that the various blocks discussed in the above application may be implemented in integrated circuits along with other functionality. Such integrated circuits may include all of the functions of a given block, system or circuit, or a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing system, the data processing system comprising:
   a decoder hardware circuit operable to apply a low density parity check algorithm to a decoder input to yield an interim decoded output, wherein the decoder input is a codeword formed of two bit symbols, and wherein the decoder input is encoded to yield a last layer including a plurality of data pairings of a shift value and an entry value, wherein the shift value for all of the plurality of data pairings is the same, and wherein the entry values included in the plurality of data pairings exhibit at least two different entry values; and
   an inverse mapping hardware circuit operable to remap the interim decoded output to yield an overall decoded output.

2. The data processing system of claim 1, wherein the at least two different entry values are selected from a group consisting of: 01, 10, and 11.

3. The data processing system of claim 1, wherein the plurality of shift values for all of the plurality of data pairings are zero.

4. The data processing system of claim 1, wherein the plurality of data pairings is a first plurality of data pairings, and wherein the decoder input further includes a preceding layer including a second plurality of data pairings.

5. The data processing system of claim 4, wherein the shift values for all of the first plurality of data pairings are a zero, and wherein at least one shift value of the second plurality of data pairings is non-zero.

6. The data processing system of claim 1, wherein the system further comprises: a data detector hardware circuit operable to apply a data detection algorithm to a data input to yield a detected output, wherein the decoder input is derived from the detected output.

7. The data processing system of claim 6, wherein the data detector hardware circuit is selected from a group consisting of: a Viterbi algorithm data detector circuit, and a maximum a posteriori data detector circuit.

8. The data processing system of claim 1, wherein the data processing system is implemented as an integrated circuit.

9. The data processing system of claim 1, wherein the data processing system is incorporated in a device selected from a group consisting of: a storage device, and a data transmission device.

10. The data processing system of claim 1, wherein:
    the data decoder hardware circuit includes at least a first variable node unit, a second variable node unit, and a shifter circuit;
    an output of the first variable node unit is shifted by the shifter circuit to yield the interim decoded output, and wherein the interim decoded output is provided to the second variable node unit; and
    an input of the first variable node unit is derived from an output of the second variable node unit.

11. A method for data processing, the method comprising:
    receiving a decoder input, wherein the decoder input is a codeword formed of two bit symbols, and wherein the decoder input is encoded to yield a last layer including a plurality of data pairings of a shift value and an entry value, wherein the shift value for all of the plurality of data parings is the same, and wherein the entry values included in the plurality of data pairings exhibit at least two different entry values;
    applying a low density parity check algorithm to the decoder input using a decoder hardware circuit to yield an interim decoded output; and
    inverse mapping the interim decoded output using an inverse mapping hardware circuit operable to yield an overall decoded output.

12. The method of claim 11, wherein the at least two different entry values are selected from a group consisting of: 01, 10, and 11.

13. The method of claim 11, wherein the shift values for all of the plurality of data parings are zero.

14. The method of claim 11, wherein the plurality of data pairings is a first plurality of data pairings, and wherein the decoder input further includes a preceding layer including a second plurality of data pairings.

15. The method of claim 14, wherein shift values for all of the first plurality of data pairings are zero, and wherein at least one shift value of the second plurality of data pairings is non-zero.

16. The method of claim 11, wherein the method further comprises: applying a data detection algorithm to a data input using a data detector hardware circuit to yield a detected output, wherein the decoder input is derived from the detected output.

17. The method of claim 16, wherein the data detection algorithm is selected from a group consisting of: a Viterbi algorithm data detection algorithm, and a maximum a posteriori data detection algorithm.

18. A storage device, the storage device comprising:
    a storage medium;
    a head assembly disposed in relation to the storage medium and operable to provide a sensed signal corresponding to a data set on the storage;
    a read channel circuit including:
        an analog front end circuit operable to provide an analog signal corresponding to the sensed signal;
        an analog to digital converter circuit operable to sample the analog signal to yield a series of digital samples;
        an equalizer circuit operable to equalize the digital samples to yield a sample set;
        a data detector circuit operable to apply a data detection algorithm to the sample set to yield a detected output;
        a data decoder circuit operable to apply a low density parity check algorithm to a decoder input to yield an interim decoded output, wherein the decoder input is derived from the detected output and is encoded to yield a last layer including a plurality of data pairings of a shift value and an entry value, wherein the shift value for all of the plurality of data parings is the same, and wherein the entry values included in the plurality of data pairings exhibit at least two different entry values, and wherein the decoder input is a codeword formed of two bit symbols; and an inverse mapping circuit operable to remap the interim decoded output to yield a data output.

19. The storage device of claim 18, wherein the plurality of data pairings is a first plurality of data pairings, wherein the decoder input further includes a preceding layer including a second plurality of data pairings, wherein shift values for all of the first plurality of data pairings are zero, and wherein at least one shift value of the second plurality of data pairings is non-zero.

20. The storage device of claim 18, wherein:
the decoder circuit includes at least a first variable node unit, a second variable node unit, and a shifter circuit;
an output of the first variable node unit is shifted by the shifter circuit to yield the interim decoded output, and wherein the interim decoded output is provided to the second variable node unit; and
an input of the first variable node unit is derived from an output of the second variable node unit.

\* \* \* \* \*